US012614655B2

(12) United States Patent
Ogino et al.

(10) Patent No.: US 12,614,655 B2
(45) Date of Patent: Apr. 28, 2026

(54) POLYCRYSTALLINE BULK BODY AND METHOD FOR PRODUCING SAME

(71) Applicants: NATIONAL INSTITUTE OF ADVANCED INDUSTRIAL SCIENCE AND TECHNOLOGY, Tokyo (JP); AISIN CORPORATION, Aichi (JP)

(72) Inventors: Hiraku Ogino, Tsukuba (JP); Shigeyuki Ishida, Tsukuba (JP); PavanKumarNaik Sugali, Tsukuba (JP); Hiroshi Eisaki, Tsukuba (JP); Akira Iyo, Tsukuba (JP); Kenji Kawashima, Aichi (JP); Yoshihisa Kamiya, Aichi (JP)

(73) Assignees: NATIONAL INSTITUTE OF ADVANCED INDUSTRIAL SCIENCE AND TECHNOLOGY, Tokyo (JP); AISIN CORPORATION, Aichi (JP)

( * ) Notice: Subject to any disclaimer, the term of this patent is extended or adjusted under 35 U.S.C. 154(b) by 1092 days.

(21) Appl. No.: 17/639,377

(22) PCT Filed: Aug. 21, 2020

(86) PCT No.: PCT/JP2020/031547
§ 371 (c)(1),
(2) Date: Mar. 1, 2022

(87) PCT Pub. No.: WO2021/044871
PCT Pub. Date: Mar. 11, 2021

(65) Prior Publication Data
US 2022/0270794 A1 Aug. 25, 2022

(30) Foreign Application Priority Data
Sep. 3, 2019 (JP) ................................. 2019-160524

(51) Int. Cl.
H01F 6/00 (2006.01)
B22F 3/105 (2006.01)
(Continued)

(52) U.S. Cl.
CPC ................ H01F 6/00 (2013.01); B22F 3/105 (2013.01); C01G 49/00 (2013.01); C22C 38/002 (2013.01); C22C 38/005 (2013.01); H10N 60/01 (2023.02)

(58) Field of Classification Search
CPC ....................................................... H01F 6/00
See application file for complete search history.

(56) References Cited

U.S. PATENT DOCUMENTS 5,470,821 A * 11/1995 Wong ................... H10N 60/857
252/514
2018/0053587 A1 2/2018 Weiss et al.
2019/0385769 A1 12/2019 Weiss et al.

FOREIGN PATENT DOCUMENTS

CN 102615280 8/2012
CN 108666045 10/2018
(Continued)

OTHER PUBLICATIONS

Kenji Kawashima et al., "Search for new Fe-based superconductors" Teion Kogaku, Nov. 20, 2017, vol. 52, No. 6, pp. 389-396.
(Continued)

*Primary Examiner* — Paul A Wartalowicz
(74) *Attorney, Agent, or Firm* — Casimir Jones, S.C.; Robert A. Goetz

(57) ABSTRACT
A polycrystalline bulk body of this invention has uniformity in superconducting properties, in comparison to a polycrystalline bulk body including crystal grains each constituted by $(Ba_{1-x}K_x)Fe_2As_2$. A polycrystalline bulk body (1) of this invention includes crystal grains each constituted by an
(Continued)

iron-based compound (10) expressed by chemical formula AA'Fe$_4$As$_4$, where A is Ca and A' is K, the iron-based compound (10) having a crystal structure in which AFe$_2$As$_2$ layers (16) and A'Fe$_2$As$_2$ layers (17) are alternately stacked.

7 Claims, 7 Drawing Sheets

(51) Int. Cl.
     C01G 49/00        (2006.01)
     C22C 38/00        (2006.01)
     H10N 60/01        (2023.01)

(56)           References Cited

FOREIGN PATENT DOCUMENTS

| | | |
|---|---|---|
| CN | 108878051 | 11/2018 |
| JP | 2014-240521 | 12/2014 |
| JP | 2017-082318 | 5/2017 |
| JP | 2018-512737 | 5/2018 |
| JP | 2019-049030 | 3/2019 |

OTHER PUBLICATIONS

Written Opinion for PCT/JP2020/031547 and its English translation, mailed Nov. 2, 2020, 8 pages.
International Search Report for PCT/JP2020/031547 and its English translation, mailed Nov. 2, 2020, 6 pages.

* cited by examiner

FIG. 5

POLYCRYSTALLINE BULK BODY AND METHOD FOR PRODUCING SAME

TECHNICAL FIELD

The present invention relates to a polycrystalline bulk body and a method for producing the polycrystalline bulk body.

BACKGROUND ART

There has been known an iron-based compound being expressed by chemical formula $(Ba_{1-x}K_x)Fe_2As_2$ and having a crystal structure that is $ThCr_2Si_2$ structure (space group: body-centered tetragonal crystal I4/mmm). Hereinafter, this compound will also be expressed as "BaK122".

BaK122 in which a substitution content x is within a given range exhibits superconductivity. BaK122 has a critical temperature (Tc) that varies depending on the substitution content x. When x=0.4, Tc exhibits a maximum value (38K). That is, either with a substitution content x of higher than 0.4 or a substitution content x of lower than 0.4, Tc of BaK122 is lower than 38K. Similarly to Tc, a critical current density (Jc) also varies depending on the substitution content x.

Patent Literature 1 discloses a polycrystalline bulk body that is a bulk body of a polycrystal of BaK122. Such a polycrystalline bulk body is one example of a polycrystalline bulk body that is a superconductor, and is known to function as a magnet by trapping the magnetic flux. The magnet made of the polycrystalline bulk body is used in, e.g., magnetic resonance imager (MRI).

CITATION LIST

Patent Literature

[Patent Literature 1]
Published Japanese Translation of PCT International Application, Tokuhyo, No. 2018-512737 (published on May 17, 2018)

SUMMARY OF INVENTION

Technical Problem

However, due to high vapor pressures of Ba and K, Ba and K are evaporated easily and in different degrees at the time of production of BaK122. Thus, even if the same preparation compositional ratio is employed for production of BaK122, the substitution content x varies each time of production. Consequently, the superconducting properties represented by Tc and Jc vary each time of production, disadvantageously.

The present invention was made in view of the above problem, and an aspect of the present invention has an object to provide a polycrystalline bulk body having uniformity in superconducting properties in comparison to a polycrystalline bulk body of an iron-based compound expressed by chemical formula $(Ba_{1-x}K_x)Fe_2As_2$.

Solution to Problem

In order to attain the above object, a polycrystalline bulk body in accordance with a first aspect of the present invention includes: crystal grains each of which is an iron-based compound expressed by chemical formula $AA'Fe_4As_4$, where A is Ca, part of A is optionally substituted by at least one of Sr and Eu, and A' is at least one element selected from K, Rb, and Cs, the iron-based compound having a crystal structure in which $AFe_2As_2$ layers and $A'Fe_2As_2$ layers are alternately stacked, the crystal structure having a space group of a simple tetragonal crystal P4/mmm, the iron-based compound exhibiting superconductivity in a temperature range below a critical temperature.

A method for producing a polycrystalline bulk body in accordance with another aspect of the present invention is a method for producing a polycrystalline bulk body of an iron-based compound expressed by chemical formula $AA'Fe_4As_4$, where A is Ca, part of A is optionally substituted by at least one of Sr and Eu, A' is at least one element selected from K, Rb, and Cs, the method including: a mixing step of mixing elements A, A', Fe, and As or compounds containing A, A', Fe, and As, each of which is a starting material; a pressurizing step of pressurizing a mixture resulting from the mixing in the mixing step; and a heating step of heating the mixture at a temperature of not less than 750° C. and not more than 1000° C. in a state where the mixture is sealed in a container, the heating step being carried out after or in parallel with the pressurizing step.

Advantageous Effects of Invention

A polycrystalline bulk body in accordance with an aspect of the present invention has uniformity in superconducting properties in comparison to a polycrystalline bulk body including crystal grains each constituted by $(Ba_{1-x}K_x)Fe_2As_2$.

BRIEF DESCRIPTION OF DRAWINGS (a) of FIG. 1 is a perspective view illustrating a crystal structure of an iron-based compound constituting each crystal grain of a polycrystalline bulk body in accordance with Embodiment 1 of the present invention. (b) of FIG. 1 is a perspective view of the polycrystalline bulk body shown in (a) of FIG. 1.

FIG. 5 shows a graph illustrating temperature dependencies of Jc of reference examples of the compound shown in (a) of FIG. 1.

Figure 7:
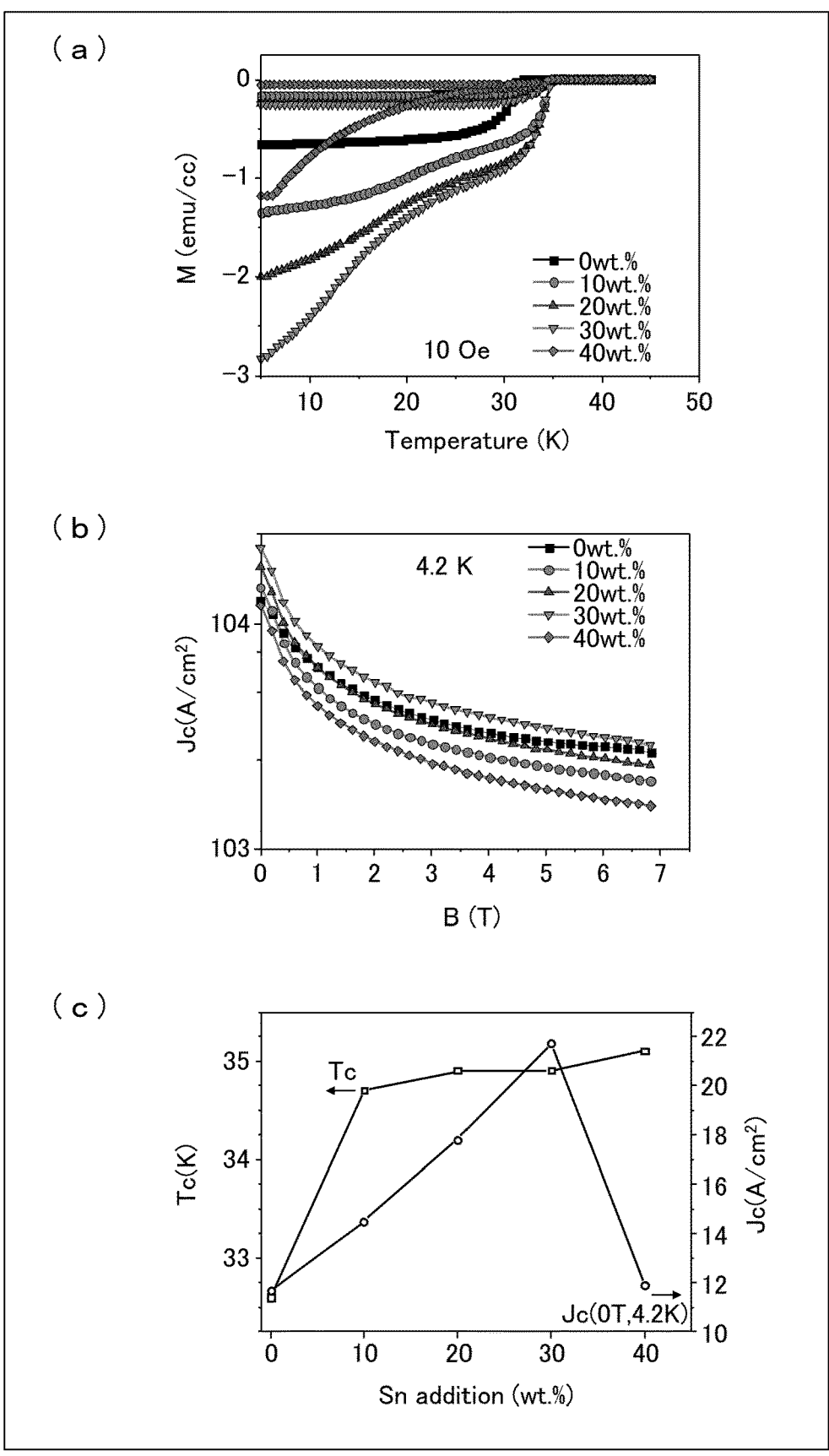

(a) of FIG. 7 shows a graph illustrating temperature dependencies of diamagnetization observed in Examples 6 to 10 of the present invention, and (b) of FIG. 7 shows a graph illustrating temperature dependencies of Jc observed in Examples 6 to 10 of the present invention. (c) of FIG. 7 shows a graph illustrating dependencies of Tc and Jc with respect to the added amount of tin observed in Examples 6 to 10 of the present invention.

Figure 8:
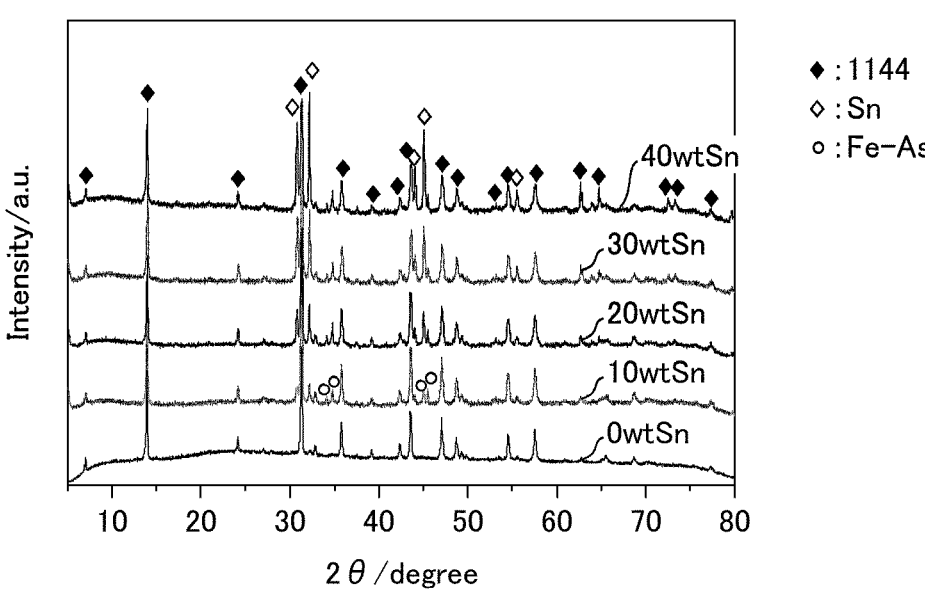

FIG. 8 shows a graph illustrating XRD patterns of Examples 6 to 10 of the present invention.

DESCRIPTION OF EMBODIMENTS

Embodiment 1

<Outline of Compound 10>

An iron-based compound 10 constituting each crystal grain of a polycrystalline bulk body 1 in accordance with an embodiment of the present invention is a compound expressed by chemical formula $AA'Fe_4As_4$.

In chemical formula $AA'Fe_4As_4$, A is Ca and part of A is optionally substituted by at least one of Sr and Eu. In the following explanation of Embodiment 1, A is assumed as Ca. A' is at least one element selected from K, Rb, and Cs. In one aspect of the present invention, A' is K and part of A' is optionally substituted by at least one of Rb and Cs. In the following explanation of Embodiment 1, A' is assumed as K. That is, in Embodiment 1, the compound 10 is expressed by chemical formula $CaKFe_4As_4$.

Figure 1:
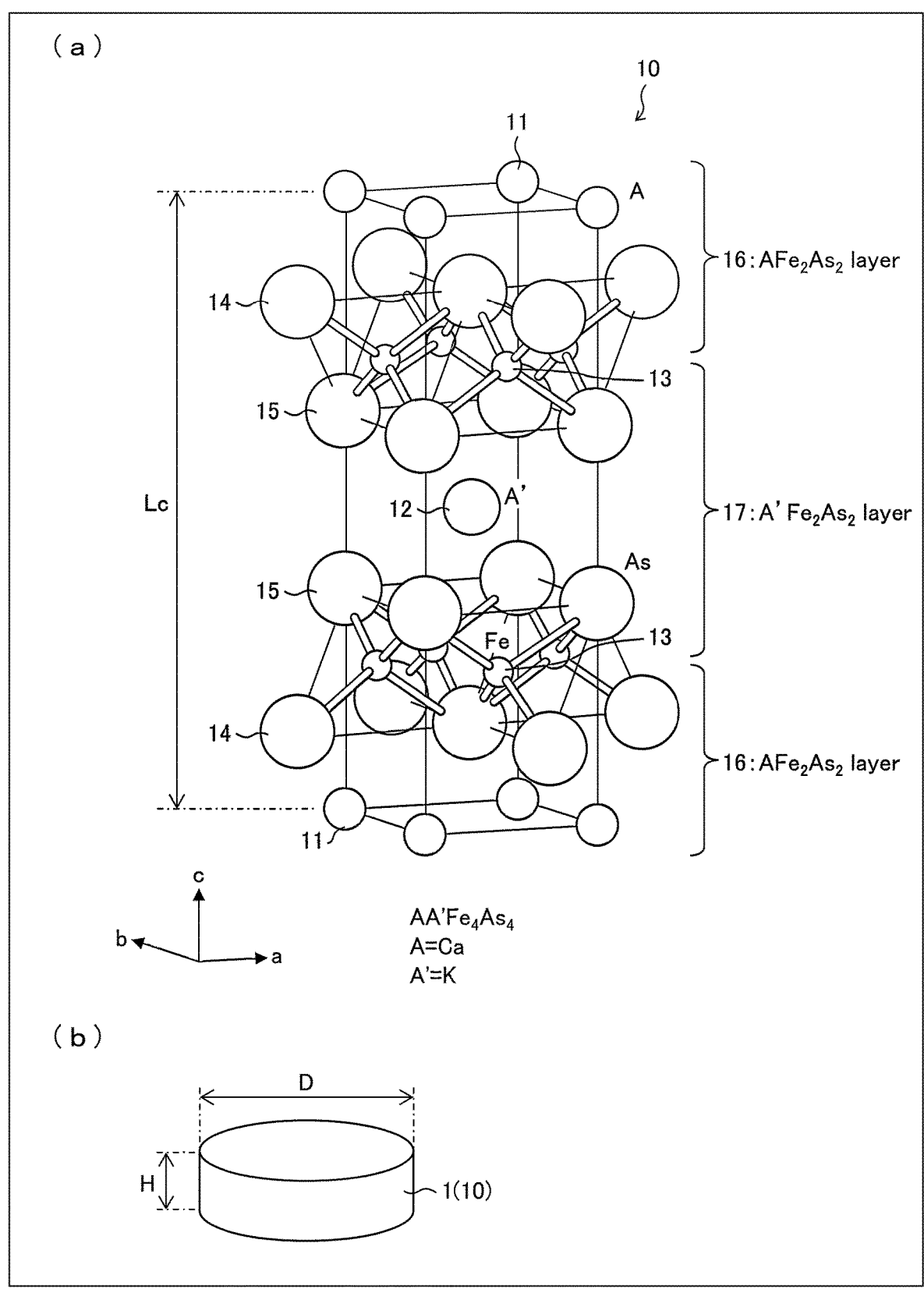

As shown in (a) of FIG. 1, the compound 10 has a structure in which $AFe_2As_2$ layers and $A'Fe_2As_2$ layers are alternately stacked, and the space group of the crystal structure is a simple tetragonal crystal P4/mmm.

In a temperature range below a critical temperature, the compound 10 exhibits superconductivity and also has uniformity in superconducting properties (the reasons for this will be described later). Therefore, it is possible to obtain a polycrystalline bulk body having stable superconducting properties with good repeatability.

In a case where part of Ca is substituted by at least one of Sr and Eu, a substitution content y is preferably $0<y≤0.1$, where a substitution content of at least one of Sr and Eu with respect to Ca is y. The above substitution content is suitable, because Sr and Eu are higher in cost than Ca. With this configuration, it is possible to prevent the production cost of the compound 10 from becoming too high.

Similarly, in a case where part of K is substituted by at least one of Rb and Cs, a substitution content z is preferably $0<z≤0.1$, where a substitution content of at least one of Rb and Cs with respect to K is z. The above substitution content is suitable, because Rb and Cs are higher in cost than K similarly to the case of Sr and Eu.

<Crystal Structure of Compound 10>

With reference to (a) of FIG. 1, the following description will discuss the crystal structure of the compound 10. (a) of FIG. 1 is a perspective view illustrating the crystal structure of the compound 10 constituting each crystal grain of the polycrystalline bulk body 1.

As shown in (a) of FIG. 1, the compound 10 is constituted by an A site 11 occupied by A, an A' site 12 occupied by A', an Fe site 13 occupied by Fe, an As site 14 occupied by As, and an As site 15. The compound 10 has two As sites that crystallographically differ from each other. Meanwhile, the compound $(Ba_{1-x}K_x)Fe_2As_2$ has only one As site.

The $AFe_2As_2$ layer 16 is constituted by the A site 11, the Fe site 13, and the As site 14. The $A'Fe_2As_2$ layer 17 is constituted by the A' site 12, the Fe site 13, and the As site 15.

In the compound 10, the A ion and the A' ion have ion radii significantly different from each other. Due to the difference in ion radius, the A ion occupies the A site 11 but cannot occupy the A' site 12, whereas the A' ion occupies the A' site 12 but cannot occupy the A site 11.

As described above, the ion occupying the A site 11 and the ion occupying the A' site 12 are different from each other. Consequently, the crystal structure of the compound 10 is a stacked structure in which the $AFe_2As_2$ layers 15 and the $A'Fe_2As_2$ layers 16 are regularly stacked. As a result, while the iron-based compound expressed by chemical formula $(Ba_{1-x}K_x)Fe_2As_2$ (hereinafter, this compound will also be referred to as "BaK122") has a crystal structure having a space group of a body-centered tetragonal crystal I4/mmm, the compound 10 has a crystal structure having a space group of a simple tetragonal crystal P4/mmm.

Due to the above-described crystal structure, the compound 10 has a compositional ratio between A and A' fixed at 1:1, and cannot take any compositional ratio other than 1:1. This brings about a remarkable effect of capable of suppressing a variation in compositional ratio between A and A', unlike BaK122 which is completely different from the compound 10 in that BaK122 can take a compositional ratio between Ba and K continuously variable from 1:0 to 0:1. Consequently, the critical temperature of the compound 10 is fixed at a value unique to the compound 10. Therefore, it is possible to suppress ununiformity in superconducting properties that might otherwise occur at the time of production of the compound 10. That is, it is possible to enhance the yield and the stability in quality in production of the compound 10.

The compound 10 having not been subjected to the later-described heat treatment step S14 has a lattice constant (Lc), in a c-axis direction, of approximately 12.84Å and Tc of approximately 32K. Meanwhile, the compound 10 having been subjected to the heat treatment step S14 has Lc of not less than 12.85Å and Tc increased to approximately 35K. Thus, the compound 10 has a lattice constant Lc of preferably not less than 12.85Å.

<Polycrystalline Bulk Body 1>

Figure 2:
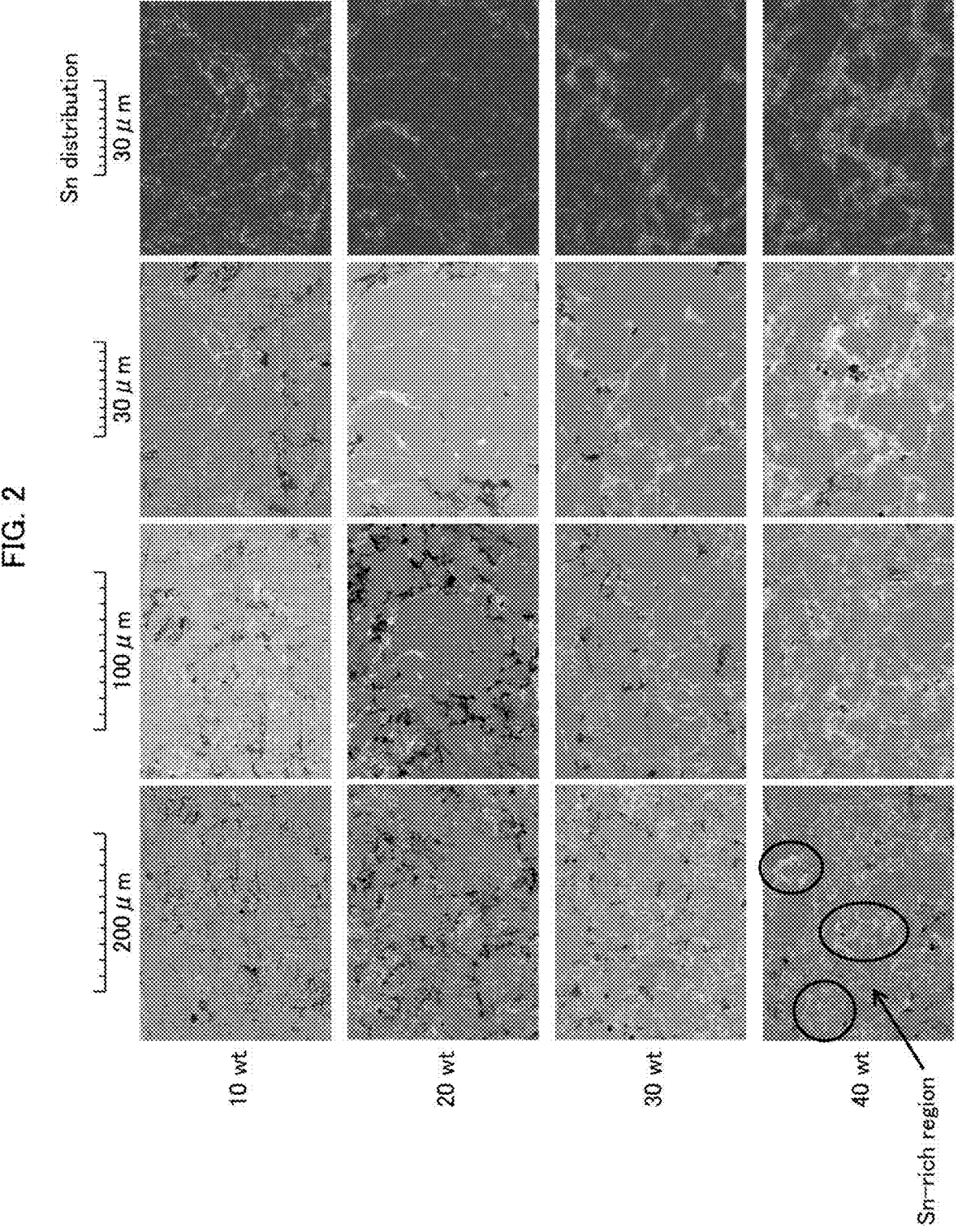
FIG. 2 shows electron microscopic images of polycrystalline bulk bodies containing tin.

With reference to (b) of FIG. 1 and FIG. 2, the following description will discuss the polycrystalline bulk body 1, which is a bulk body of a polycrystal of the compound 10. (b) of FIG. 1 is a perspective view of the polycrystalline bulk body 1. In (b) of FIG. 1, the crystal grains each constituted by the compound 10 are not illustrated. FIG. 2 shows electron microscopic images of the polycrystalline bulk bodies 1 containing tin. Shown in FIG. 2 are electron microscopic images of compounds 10 containing tin in different amounts, specifically, 10 wt %, 20 wt %, 30 wt %, and 40 wt %, taken at magnifications of 200 times, 400 times, and 1500 times. The images shown in FIG. 2 also include images illustrating Sn distributions in the compounds 10.

As shown in (b) of FIG. 1, in Embodiment 1, the polycrystalline bulk body 1 is formed in a disk shape or a cylindrical shape having a height H and a diameter D, the height H being smaller than the diameter D. The shape and size of the polycrystalline bulk body 1 are not limited to any particular ones, and the polycrystalline bulk body 1 can be formed into an arbitrary shape of an arbitrary size in the later-described pressurizing step S12. As one example, in Embodiment 1, the diameter D is 10 mm and the height H is 3 mm.

As shown in FIG. 2, the polycrystalline bulk body 1 preferably contains at least one selected from low-melting metals (tin, gallium, indium, and lead), and the at least one selected from low-melting metals is more preferably filled in at least part of the grain boundary of each crystal grain of the compound 10.

With these features, the low-melting metal increases the strength of electrical coupling between the crystal grains at the grain boundaries, and consequently the critical current density (Jc) of the polycrystalline bulk body 1 increases.

(Effects of Polycrystalline Bulk Body 1)

As described above, the polycrystalline bulk body 1 includes crystal grains each of which is an iron-based compound expressed by chemical formula $AA'Fe_4As_4$, where A is Ca, part of A is optionally substituted by at least one of Sr and Eu, and A' is at least one element selected from K, Rb, and Cs, the iron-based compound having a crystal structure in which $AFe_2As_2$ layers and $A'Fe_2As_2$ layers are alternately stacked, the crystal structure having a space group of a simple tetragonal crystal P4/mmm, the iron-based compound exhibiting superconductivity in a temperature range below the critical temperature. In Embodiment 1, A is Ca and A' is K.

In comparison to a polycrystalline bulk body including crystal grains each constituted by BaK122, ununiformity that can occur in the superconducting properties represented by Tc and Jc can be suppressed in the polycrystalline bulk body 1. In BaK122, the substitution content x can easily vary due to K substituting part of the Ba site. Meanwhile, in the compound expressed by chemical formula $AA'Fe_4As_4$ (hereinafter, this compound will also be referred to as "AA'1144"), a ratio between A and A' is fixed substantially at 1:1 due to A and A' occupying different sites.

In addition, the polycrystalline bulk body 1 can be used as a magnet in a temperature range closer to the critical temperature, i.e., in a higher temperature range, in comparison to the polycrystalline bulk body of BaK122. This is due to the following reason. That is, as the temperature is increased from a lower temperature side within a temperature range below the critical temperature, (1) the superconducting properties (e.g., the critical current density) of BaK122 are gradually impaired, whereas (2) the superconducting properties of AA'1144 would not vary considerably until the temperature gets close to the critical temperature.

In the polycrystalline bulk body 1, A' is K and part of A' is optionally substituted by at least one of Rb and Cs.

With the above configuration, it is possible to reduce the production cost of the polycrystalline bulk body.

As described above, the polycrystalline bulk body 1 preferably has a lattice constant Lc, in the c-axis direction in the crystal structure shown in FIG. 1, of not less than 12.85Å.

With the above configuration, it is possible to obtain a polycrystalline bulk body having a higher Tc than that of a polycrystalline bulk body having a lattice constant Lc of less than 12.85Å.

The polycrystalline bulk body 1 preferably contains at least one selected from tin, gallium, and indium.

By adding at least one selected from tin, gallium, and indium to the polycrystalline bulk body 1, it is possible to increase the strength of electrical coupling between the crystal grains. Thus, the polycrystalline bulk body having the above configuration can enhance Jc, in comparison to a polycrystalline bulk body not containing at least one selected from tin, gallium, and indium.

In the polycrystalline bulk body 1, at least one selected from tin, gallium, and indium is preferably filled in at least part of the grain boundary of each crystal grain of the compound 10.

With the above configuration, at least one of tin, gallium, and indium exists generally on the grain boundary of each crystal grain, and does not exist inside each crystal grain. That is, at least one of tin, gallium, and indium hardly disturbs the crystal structure of each crystal grain of AA'1144. Thus, the polycrystalline bulk body in accordance with Embodiment 1 can further enhance Jc, in comparison to a polycrystalline bulk body not containing at least one of tin, gallium, and indium.

Embodiment 2

<Production Method M10>

Figure 3:
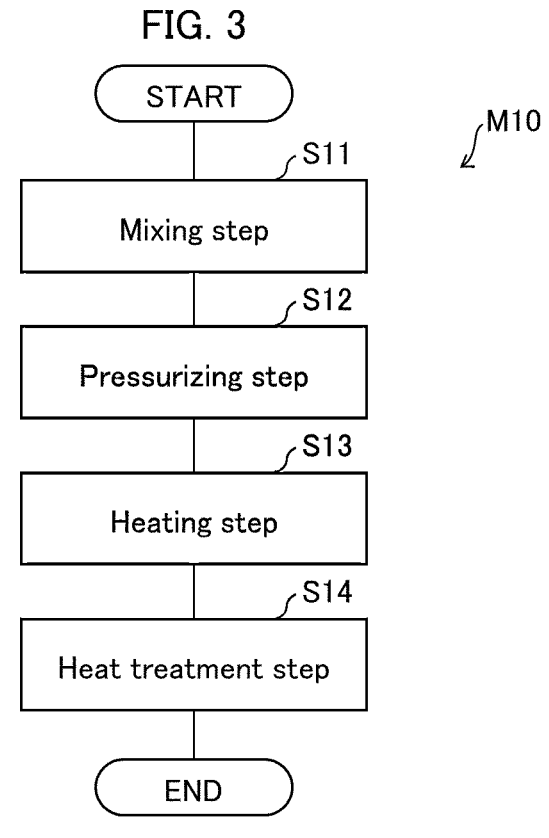
FIG. 3 shows a flowchart illustrating a method for producing a polycrystalline bulk body in accordance with Embodiment 2 of the present invention.
Figure 4:
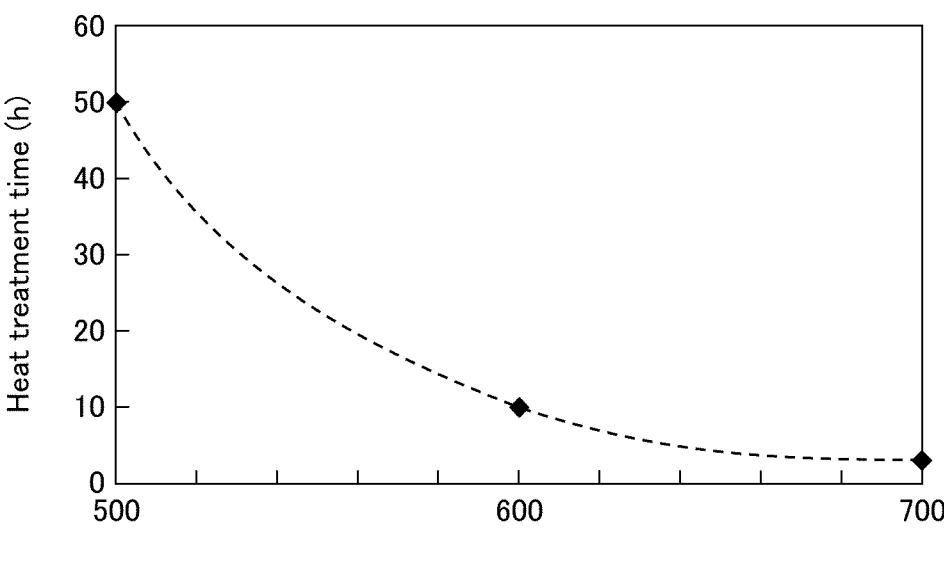
FIG. 4 shows a graph illustrating a dependence of a heat treatment time with respect to a heat treatment temperature, the dependence being used as a criterion for avoiding generation of an impurity in a polycrystalline bulk body in a heat treatment step shown in FIG. 3.

With reference to FIGS. 3 and 4, the following description will discuss a method M10 for producing a polycrystalline bulk body in accordance with Embodiment 2 of the present invention. The production method M10 is suitably applicable to production of the polycrystalline bulk body 1 shown in FIG. 1. FIG. 3 shows a flowchart of the production method M10. FIG. 4 shows a graph illustrating a dependence of a heat treatment time with respect to a heat treatment temperature, the dependence being used as a criterion for avoiding generation of an impurity in a polycrystalline bulk body 1 in the later-described heat treatment step S14.

As shown in FIG. 3, the production method M10 includes a mixing step S11, the pressurizing step S12, a heating step S13, and the heat treatment step S14.

(Mixing Step S11)

The mixing step S11 is a step of mixing the elements A, A', Fe, and As or the compounds containing A, A', Fe, and As, each of which is a starting material. Carrying out the mixing step S11 yields a mixture of the starting materials. Note that the elements A, A', Fe, and As or the compounds containing A, A', Fe, and As are weighed in advance in a weighing step. The weighing step will be described later.

The starting materials may be the elements A, A', Fe, and As or the compounds containing A, A', Fe, and As. More preferably, the starting materials contain at least AAs, A'As, and $Fe_2As$. As the compounds AAs, A'As, and $Fe_2As$, high-purity compounds are commercially available. Use of these starting materials enables stably supply of an iron-based compound at an affordable price. For example, in order to produce an iron-based compound in which A is Ca and A' is K, it is possible to employ, as the starting materials, CaAs, KAs, and $Fe_2As$ in combination. In order to produce an iron-based compound containing, as A', both Rb and Cs, a starting material containing Sr and a starting material containing Eu may be employed as A', and may be mixed and used.

Preferably, each starting material can be crushed into a powder. By using the starting materials in powdery form, it is easy to mix the starting materials uniformly in the mixing step S11.

The mixing step S11 may be a step of mixing the starting materials, and is more preferably carried out in an inert gas atmosphere, for example. Examples of the inert gas encompass a nitrogen gas and an argon gas. The environment of the inert gas atmosphere can be achieved by filling a glovebox with the inert gas. By carrying out the mixing step S11 in the inert gas atmosphere, it is possible to prevent deterioration (mostly, oxidization) of the starting materials in the mixing step S11.

Note that the tool used in the mixing step S11 is not limited to any particular one, provided that the tool can mix the starting materials. For example, the tool may be a mortar.

(Pressurizing Step S12)

The pressurizing step S12 is a step of pressurizing the mixture resulting from the mixing in the mixing step S11. In the pressurizing step S12, the mixture is sealed in a container, and the mixture is externally pressurized so as to form the mixture into a desired shape, e.g., a disk shape or a cylindrical shape. By carrying out the pressurizing step S12, the mixture is formed into a desired shape.

In a case where the pressurizing step S12 and the later-described heating step S13 are carried out in parallel, the mixture is heated while being pressurized. This promotes a reaction between the starting materials. This can shorten the heating time and yield a firm polycrystalline bulk body 1, thereby making it easy to take out the polycrystalline bulk body 1 from the container after heating.

Similarly to the mixing step S11, the pressurizing step S12 is preferably carried out in an inert gas atmosphere. By carrying out these steps in an inert gas atmosphere, it is possible to prevent deterioration of the mixture.

The container in which the mixture is to be sealed is preferably made of a material that is difficult to react with A, A', Fe, and As contained in the mixture and with oxygen and nitrogen at a high temperature of not less than 1000° C. Such a material may be a stainless steel, for example.

(Heating Step S13)

The heating step S13 is a step carried out after or in parallel with the pressurizing step S12. For the reasons described above, the heating step S13 is preferably carried out in parallel with the pressurizing step S12.

In the heating step S13, the mixture is heated at a heating temperature of not less than 750° C. and not more than 1000° C. in a state where the mixture is sealed in the container.

The heating method employed to carry out the heating step S13 is not limited to any particular one. However, the heating method is preferably the one with which the heating step S13 can be carried out in parallel with the pressurizing step S12. Such a heating method may be a spark plasma sintering technique, for example.

In a case where the heating step S13 is to be carried out after the pressurizing step S12, the heating method used to carry out the heating step S13 may be any heating method, provided that the heating method enables heating sintering. Such a heating method may be a heating method involving use of an electric furnace, for example.

In a case of a polycrystalline bulk body in which A is Ca and A' is K like the polycrystalline bulk body 1 in accordance with Embodiment 2, the heating temperature in the heating step S13 is preferably higher than 800° C., more preferably a temperature close to 900° C. The heating time in the heating step S13 is preferably not less than three minutes. By setting the heating time so as to be not less than three minutes, it is possible to proceed the reaction between the starting materials to a sufficient degree. The heating time is preferably not more than one hour. Within a range of a heating time of not less than three minutes and not more than one hour, setting the heating time longer tends to increase the purity of the iron-based compound in the produced sample. Setting the heating time so as to exceed one hour may sometimes result in saturation of the purity of the iron-based compound in the sample. Thus, by setting the heating time so as to be not more than one hour, it is possible to produce a sample having a sufficient degree of purity without taking an extra time.

(Heat Treatment Step S14)

The heat treatment step S14 is a step of subjecting, to a heat treatment, the mixture having been subjected to the heating step S13 by leaving, in an environment of a temperature of less than 750° C., the mixture sealed in the container. This heat treatment may also be expressed as an annealing treatment. Hereinafter, the temperature at which the mixture is left in the heat treatment step S14 will also be referred to as a "heat treatment temperature".

The heat treatment step S14 can be carried out, after the heating step S13, (1) by setting the temperature so as to be less than 750° C. or (2) by setting the temperature of the compound back to a room temperature, heating the compound again, and then setting the temperature so as to be less than 750° C.

In a case of a polycrystalline bulk body in which A is Ca and A' is K like the polycrystalline bulk body 1 in accordance with Embodiment 2, a phase (so-called impurity) different from the compound 10 is often generated in the mixture when the heat treatment temperature is a temperature close to 800° C. Thus, in a case where the temperature is lowered so as to cause a transition from the heating step S13 to the heat treatment step S14, it is preferable to pass through a temperature range in the vicinity of 800° C. as quickly as possible.

In a case where the heat treatment step S14 is carried out for a too long period of time, an impurity is likely to be generated in the polycrystalline bulk body 1 even when the heat treatment step S14 is carried out with a heat treatment temperature of less than 750° C. In a case of a polycrystalline bulk body in which A is Ca and A' is K, a heat treatment time that hardly causes an impurity is, as shown in FIG. 4, 50 hours when the heat treatment temperature is 500° C., 10 hours when the heat treatment temperature is 600° C., and 3 hours when the heat treatment temperature is 700° C.

The broken line in FIG. 4 is a curved line obtained by fitting the above-described three blots. Even with a heat treatment temperature other than the heat treatment temperatures of 500° C., 600° C., and 700° C., selecting a heat treatment time less than the broken line in FIG. 4 makes it possible to suppress an impurity that might otherwise be generated in the polycrystalline bulk body 1.

Carrying out the heat treatment step S14 after the heating step S13 increases the lattice constant Lc in the c-axis direction of the compound 10. More specifically, before the heat treatment step S14, the lattice constant Lc is less than 12.85Å (for example, 12.84Å). Meanwhile, after the heat treatment step S14, the lattice constant Lc is as large as 12.85Å or more. As a result, Tc of the compound 10, which is approximately 32K before the heat treatment step S14, is increased to approximately 35K. Thus, by carrying out the heat treatment step S14, it is possible to increase Tc of the polycrystalline bulk body 1.

The heat treatment step S14 is preferably configured to subject the mixture to the heat treatment in a state where the mixture having been subjected to the heating step S13 and at least one selected from tin, gallium, and indium, each of which is a low-melting metal, are sealed in the container. By carrying out the heat treatment step S14, it is possible to add, to the polycrystalline bulk body 1, at least one selected from tin, gallium and indium. More specifically, it is possible to fill, in at least part of the grain boundary of each crystal grain of the compound 10 constituting the polycrystalline bulk body 1, at least one selected from tin, gallium and indium.

The polycrystalline bulk body 1 containing at least one selected from tin, gallium, and indium exhibits a higher Jc than that of a polycrystalline bulk body 1 not containing at least one selected from tin, gallium, and indium. The reason for this is considered as follows. That is, filling at least one selected from tin, gallium and indium in at least part of the grain boundary of each crystal grain of the compound 10 increases the strength of electrical coupling between the crystal grains. In addition, when the polycrystalline bulk body 1 containing at least one selected from tin, gallium, and indium is subjected to the above-described heat treatment, the lattice constant Lc is increased and Tc is also increased.

The amount of at least one selected from tin, gallium, and indium to be added has an optimum value. For example, the polycrystalline bulk bodies 1 shown in FIG. 2 that respectively contained tin in amounts of 10 wt %, 20 wt %, and 30 wt % exhibited higher Jc in increasing order of the added amount of tin. However, the polycrystalline bulk body 1 containing tin in an amount of 40 wt % exhibited Jc lower than that of the polycrystalline bulk body 1 containing tin in an amount of 30 wt %.

It is considered that the optimum value also depends on the method for carrying out the pressurizing step S12 and the heating step S13.

(Weighing Step)

As described above, the production method M10 includes, prior to the mixing step S11, the weighing step of weighing the compounds that are the starting materials.

A preparation compositional ratio between the starting materials that are to be weighed in the weighing step can be set as appropriate in accordance with the iron-based compound to be produced, the production method, and/or the like. For example, A:A':Fe:As=1:1:4:4 may be employed as a basic compositional ratio. However, as described later, the compositional ratio is not limited to this. Molar ratios of A, A', and As with respect to the number of moles of Fe can be changed as appropriate within given ranges.

The molar ratio of A to be weighed in the weighing step with respect to Fe is preferably not less than 0.125 and not more than 0.375, and the molar ratio of A' to be weighed with respect to Fe is preferably not less than 0.125 and not more than 0.375.

In the iron-based compound in accordance with an aspect of the present invention, A and A' have ion radii significantly different from each other. Thus, A' would not be positioned in the A site, and A would not be positioned in the A' site. Therefore, even if the preparation compositional ratio between the starting materials having been weighed is slightly different from A:A':Fe:As=1:1:4:4, a compositional ratio between A and A' in the iron-based compound in a produced sample is 1:1. As described above, with the production method in accordance with an aspect of the present invention, it is possible to produce an iron-based compound in accordance with the present invention.

When the preparation compositional ratio between the starting materials to be weighed is different from A:A':Fe:As=1:1:4:4, a substance (heterogeneous phase) different from the compound 10 may be generated inside the produced sample due to the difference. In many cases, the heterogeneous phase does not exhibit superconductivity. Even in this case, the compositional ratio of $AA'Fe_4As_4$ constituting a superconducting portion would not be changed from A:A':Fe:As=1:1:4:4. Therefore, the critical temperature of the compound 10 is maintained at a value specific to the substance.

More preferably, the molar ratio of A to be weighed in the weighing step with respect to Fe is more than 0.25 and not more than 0.3, the molar ratio of A' to be weighed with respect to Fe is more than 0.25 and not more than 0.3, and the molar ratio of As to be weighed with respect to Fe is more than 1 and not more than 1.2.

In the heating step, A, A', and As may possibly be evaporated slightly. In consideration of the evaporation of A, A', and As, the amounts of A, A', and As with respect to Fe may be weighed so as to be greater than the given amounts. This makes it possible to reduce the amount of heterogeneous phase to be included in a produced sample.

(Effects of Production Method in Accordance with Aspect of the Present Invention)

As described above, the production method M10 is a method for producing a polycrystalline bulk body of an iron-based compound expressed by chemical formula $AA'Fe_4As_4$. In the above chemical formula, A is Ca and part of A is optionally substituted by at least one of Sr and Eu. In the above chemical formula, A' is at least one element selected from K, Rb, and Cs. The production method M10 includes: the mixing step S11 of mixing the elements A, A', Fe, and As or the compounds containing A, A', Fe, and As, each of which is a starting material; the pressurizing step S12 of pressurizing a mixture resulting from the mixing in the mixing step S11; and the heating step S13 of heating the mixture at a temperature of not less than 750° C. and not more than 1000° C. in a state where the mixture is sealed in a container, the heating step S13 being carried out after or in parallel with the pressurizing step S12.

The production method M10 can be suitably used to produce the polycrystalline bulk body 1. That is, the production method M10 brings about effects similar to those given by the polycrystalline bulk body 1.

Preferably, the production method M10 carries out the heating step S13 by a spark plasma sintering technique.

Employment of the spark plasma sintering technique can enhance the density, thereby increasing the strength of electrical coupling between the crystal grains of the compound 10. Therefore, with the above configuration, it is possible to obtain a polycrystalline bulk body 1 having a higher Jc, in comparison to a polycrystalline bulk body 1 obtained simply by sintering, not by the spark plasma sintering technique.

In the production method M10, A' is K and part of A' is optionally substituted by at least one of Rb and Cs.

With the above configuration, it is possible to reduce the production cost of the polycrystalline bulk body 1.

Preferably, the production method M10 further includes the heat treatment step S14 of subjecting, to a heat treatment, the mixture having been subjected to the heating step S13, the heat treatment being carried out at a temperature of less than 750° C.

With the above configuration, it is possible to produce a polycrystalline bulk body 1 having a higher Tc, in comparison to a polycrystalline bulk body 1 having not been subjected to the heat treatment.

In the production method M10, the heat treatment step S14 is preferably configured to subject the mixture to the heat treatment in a state where the mixture having been subjected to the heating step S13 and at least one selected from tin, gallium, and indium are sealed in the container.

With the above configuration, at least one of tin, gallium, and indium can be added to the polycrystalline bulk body 1. Thus, it is possible to produce the polycrystalline bulk body having a higher Jc than that of a polycrystalline bulk body 1 not containing at least one of tin, gallium, and indium.

With the production method in accordance with an aspect of the present invention, it is possible to obtain a polycrystalline bulk body having superconducting properties applicable as a superconducting magnet or the like in a simple manner with good repeatability. The production method in accordance with an aspect of the present invention has less limitation on the conditions for the device and the steps. Thus, it is possible to produce a large bulk at a low cost.

The present invention encompasses the following aspects:

A polycrystalline bulk body in accordance with a first aspect of the present invention includes: crystal grains each of which is an iron-based compound expressed by chemical formula $AA'Fe_4As_4$ where A is Ca, part of A is optionally substituted by at least one of Sr and Eu, and A' is at least one element selected from K, Rb, and Cs, the iron-based compound having a crystal structure in which $AFe_2As_2$ layers and $A'Fe_2As_2$ layers are alternately stacked, the crystal structure having a space group of a simple tetragonal crystal P4/mmm, the iron-based compound exhibiting superconductivity in a temperature range below a critical temperature.

In comparison to a polycrystalline bulk body including crystal grains each constituted by BaK122, ununiformity that can occur in the superconducting properties represented by Tc and Jc can be suppressed in the polycrystalline bulk body in accordance with the first aspect of the present invention. In BaK122, the substitution content x can easily vary due to K substituting part of the Ba site. Meanwhile, in the compound expressed by chemical formula AA'Fe$_4$As$_4$ (hereinafter, this compound will also be referred to as "AA'1144"), a ratio between A and A' is fixed at substantially 1:1 due to A and A' occupying different sites.

In addition, the polycrystalline bulk body of AA'1144 can be used as a magnet in a temperature range closer to the critical temperature, i.e., in a higher temperature range, in comparison to the polycrystalline bulk body of BaK122. This is due to the following reason. That is, as the temperature is increased from a low temperature side in a temperature range below the critical temperature, (1) the superconducting properties (e.g., the critical current density) of BaK122 are gradually impaired, whereas (2) the superconducting properties of AA'1144 would not vary considerably until the temperature gets close to the critical temperature.

A polycrystalline bulk body in accordance with a second aspect of the present invention is configured such that, in the first aspect, A' is K and part of A' is optionally substituted by at least one of Rb and Cs.

With the above configuration, it is possible to reduce the production cost of the polycrystalline bulk body.

A polycrystalline bulk body in accordance with a third aspect of the present invention is configured such that, in the second aspect, the crystal structure has a lattice constant, in a c-axis direction, of not less than 12.85 Å.

With the above configuration, it is possible to obtain a polycrystalline bulk body having a higher Tc, in comparison to a case where the lattice constant Lc in the c-axis direction is less than 12.85 Å.

A polycrystalline bulk body in accordance with a fourth aspect of the present invention is configured such that, in any one of the first to third aspects, the polycrystalline bulk body contains at least one selected from tin, gallium, and indium.

By adding at least one selected from tin, gallium, and indium to the polycrystalline bulk body, it is possible to increase the strength of electrical coupling between the crystal grains. Thus, with the above configuration, it is possible to obtain a polycrystalline bulk body having a higher Jc, in comparison to a polycrystalline bulk body not containing at least one selected from tin, gallium, and indium.

A polycrystalline bulk body in accordance with a fifth aspect of the present invention is configured such that, in the fourth aspect, the at least one selected from tin, gallium, and indium is filled in at least part of a grain boundary of each of the crystal grains.

With the above configuration, at least one of tin, gallium, and indium exists generally on the grain boundary of each crystal grain, and does not exist inside each crystal grain. That is, at least one of tin, gallium, and indium hardly disturbs the crystal structure of each crystal grain of AA'1144. Thus, the polycrystalline bulk body in accordance with the above aspect can achieve an even higher Jc, in comparison to a polycrystalline bulk body not containing at least one of tin, gallium, and indium.

A method for producing a polycrystalline bulk body in accordance with a sixth aspect of the present invention is a method for producing a polycrystalline bulk body of an iron-based compound expressed by chemical formula AA'Fe$_4$As$_4$, where A is Ca, part of A is optionally substituted by at least one of Sr and Eu, A' is at least one element selected from K, Rb, and Cs, the method including: a mixing step of mixing elements A, A', Fe, and As or compounds containing A, A', Fe, and As, each of which is a starting material; a pressurizing step of pressurizing a mixture resulting from the mixing in the mixing step; and a heating step of heating the mixture at a temperature of not less than 750° C. and not more than 1000° C. in a state where the mixture is sealed in a container, the heating step being carried out after or in parallel with the pressurizing step.

The production method configured as above is suitably applicable to production of a polycrystalline bulk body in accordance with an aspect of the present invention. That is, the production method in accordance with the above aspect brings about effects similar to those given by a polycrystalline bulk body in accordance with an aspect of the present invention.

A production method in accordance with a seventh aspect of the present invention is configured such that, in the sixth aspect, the heating step is carried out by a spark plasma sintering technique.

Employment of the spark plasma sintering technique can increase the strength of electrical coupling between the crystal grains. Therefore, with the above configuration, it is possible to obtain a polycrystalline bulk body having a higher Jc, in comparison to a polycrystalline bulk body obtained simply by sintering, not by the spark plasma sintering technique.

A production method in accordance with an eighth aspect of the present invention is configured such that, in the sixth or seventh aspect, A' is K and part of A' is optionally substituted by at least one of Rb and Cs.

With the above configuration, it is possible to reduce the production cost of the polycrystalline bulk body.

A production method in accordance with a ninth aspect of the present invention is configured such that, in the eighth aspect, the production method further includes a heat treatment step of subjecting, to a heat treatment at a temperature of less than 750° C., the mixture having been subjected to the heating step.

With the above configuration, it is possible to produce a polycrystalline bulk body having a higher Tc, in comparison to a polycrystalline bulk body having not been subjected to the heat treatment.

A production method in accordance with a tenth aspect of the present invention is configured such that, in the ninth aspect, the heat treatment step subjects the mixture to the heat treatment in a state where the mixture and at least one selected from tin, gallium, and indium are sealed in the container.

With the above configuration, it is possible to add, to the polycrystalline bulk body, at least one of tin, gallium, and indium. Consequently, it is possible to produce a polycrystalline bulk body having a higher Jc, in comparison to a polycrystalline bulk body not containing at least one of tin, gallium, and indium.

Reference Examples

Figure 5:
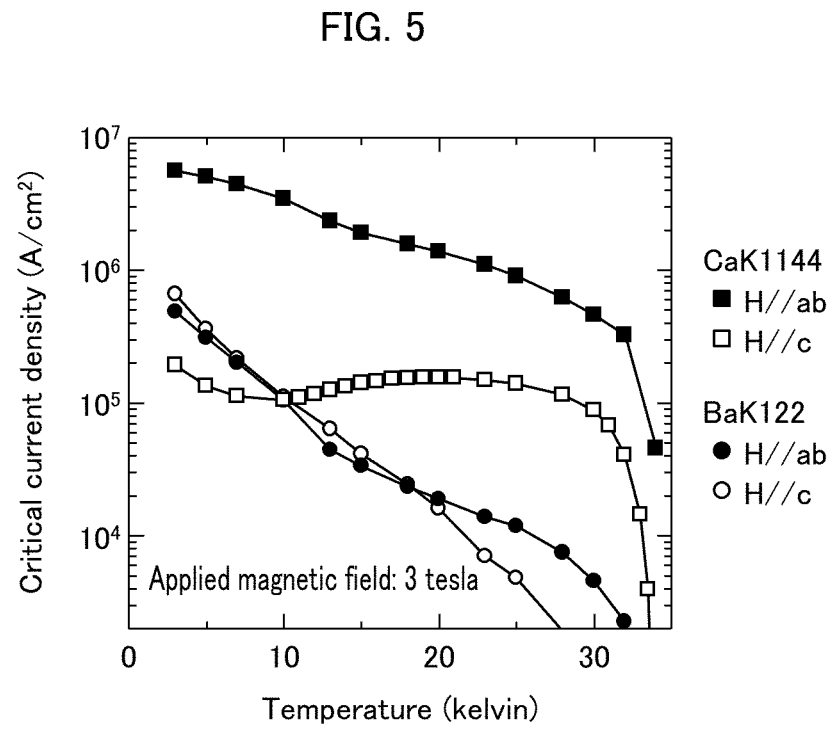

Prior to Examples of the present invention, the following description will discuss, with reference to FIG. 5, a single crystal of CaK1144, which is a reference example of the present invention, and a single crystal of BaK122, which is a reference example of a comparative example of the present invention. FIG. 5 shows a graph illustrating temperature dependencies of Jc of the single crystal of CaK1144 and Jc of the single crystal of BaK122. In FIG. 5, for each of the single crystal of CaK1144 and the single crystal of BaK122, Jc observed when a magnetic field of 3 T was applied in an ab plane direction and Jc observed when a magnetic field of 3 T was applied in a c-axis direction are plotted.

FIG. 5 indicates that, upon application of a magnetic field either in the ab plane direction or the c-axis direction, the single crystal of BaK122 exhibited Jc gently decreased as increase in the temperature. Meanwhile, FIG. 5 indicates that Jc of the single crystal of CaK1144 observed when a magnetic field was applied in the c-axis direction was lower than that observed when a magnetic field was applied in the ab plane direction. However, even with increase in the temperature, Jc of the single crystal of CaK1144 observed when a magnetic field was applied in the c-axis direction was above $10^5$ A/cm$^2$ until the temperature reached 28K.

The polycrystalline bulk body 1 employs polycrystalline CaK1144. Thus, Jc of the polycrystalline bulk body 1 cannot reach Jc of single crystalline CaK1144. However, the results of the reference examples shown in FIG. 5 suggest that the possibility that CaK1144 may be applicable as a magnet in a higher temperature range than that of BaK122.

Examples

Figure 6:
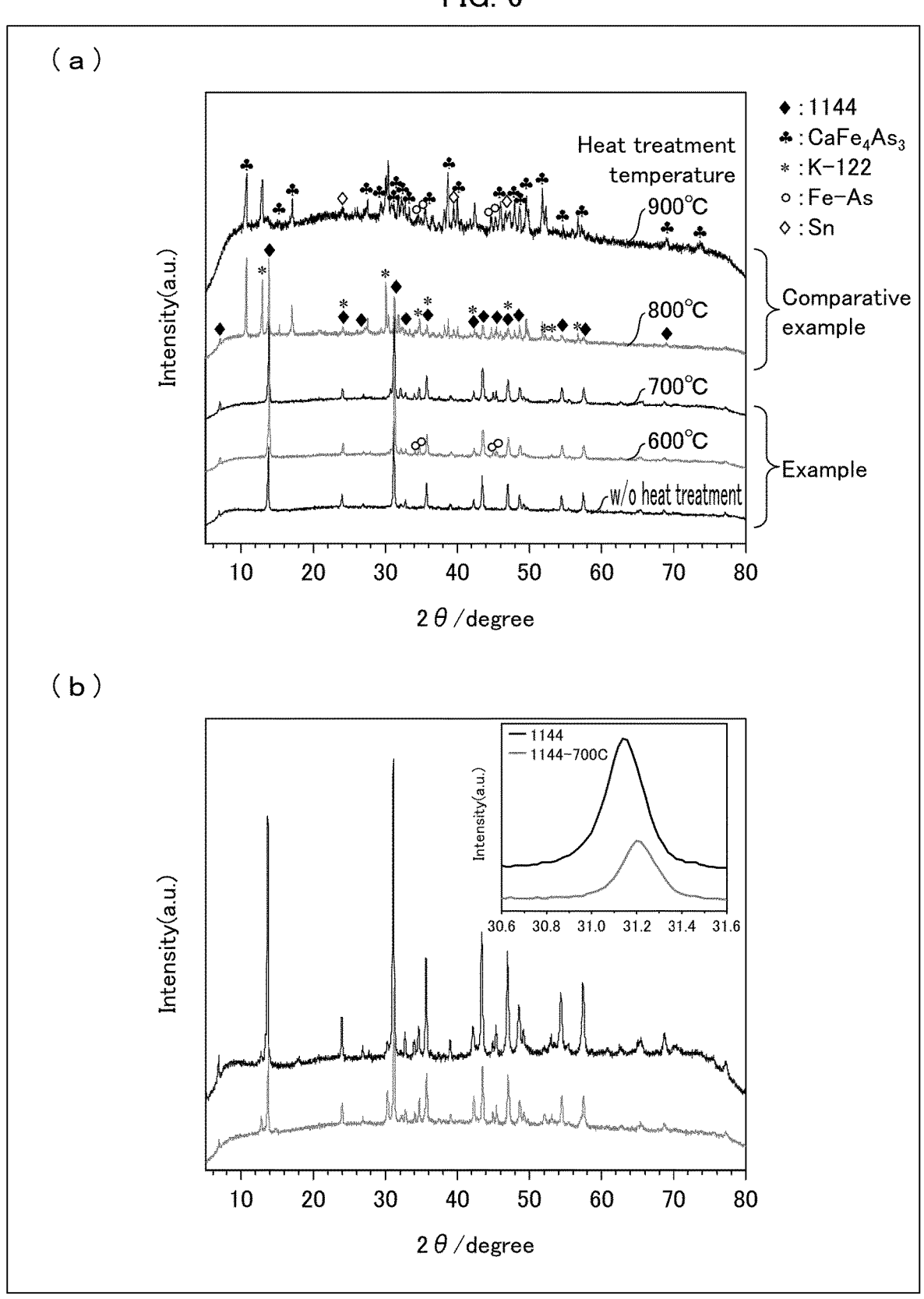
FIG. 6 shows graphs illustrating XRD patterns of Example 1, Example 5, Example 6, and Comparative Examples 1 and 2 of the present invention.

With reference to FIGS. 6 to 8, the following description will discuss Examples 1 to 10 of the present invention. (a) of FIG. 6 shows a graph illustrating XRD patterns of Example 1, Example 5, Example 6, and Comparative Examples 1 and 2. (b) of FIG. 6 shows a graph illustrating XRD patterns of Examples 1 and 6. (a) of FIG. 7 shows a graph illustrating temperature dependencies of diamagnetization observed in Examples 6 to 10, and (b) of FIG. 7 shows a graph illustrating temperature dependencies of Jc observed in Examples 6 to 10. (c) of FIG. 7 shows a graph illustrating dependencies of Tc and Jc with respect to the added amount of tin observed in Examples 6 to 10. FIG. 8 shows a graph illustrating XRD patterns of Examples 6 to 10.

Each of Examples 1 to 10 is an example of the polycrystalline bulk body 1. In order to produce each of Examples 1 to 10, the pressurizing step S12 used an isostatic press machine to form a mixture of starting materials into a disk shape, and the heating step S13 heated the mixture with an electric furnace.

In order to produce Example 1, immediately after the heating step S13, the output of the furnace was set at zero for natural cooling, and then the polycrystalline bulk body 1 was taken out from the container. That is, Example 1 was not subjected to the heat treatment step S14 and did not contain tin, which is one example of the low-melting metal.

Each of Examples 2 to 6 was a polycrystalline bulk body produced by subjecting, to the heat treatment step S14, a polycrystalline bulk body 1 produced in a similar manner to that of Example 1. The heat treatment temperature in the heat treatment step S14 carried out for Example 2 was 300° C., that for Example 3 was 400° C., that for Example 4 was 500° C., that for Example 5 was 600° C., and that for Example 6 was 700° C. The heat treatment time in the heat treatment step S14 for each of Examples 2 to 6 was three hours. That is, each of Examples 2 to 6 were subjected to the heat treatment step S14, but did not contain tin.

Polycrystalline bulk bodies 1 produced in a similar manner to that of Example 1 were subjected to the heat treatment step S14 with heat treatment temperatures of 800° C. and 900° C., respectively. Products thus obtained were used as Comparative Examples 1 and 2 of the present invention, respectively.

Each of Examples 7 to 10 was a polycrystalline bulk body produced by subjecting, to the heat treatment step S14, a polycrystalline bulk body 1 produced in a similar manner to that of Example 1. In the heat treatment step S14 for each of Examples 7 to 10, a heat treatment was carried out on the polycrystalline bulk body 1 and tin. That is, for each of Examples 7 to 10, the heat treatment step S14 was carried out and, in addition, tin was added. The amount of tin added to Example 7 was 10 wt %, the amount of tin added to Example 8 was 20 wt %, the amount of tin added to Example 9 was 30 wt %, and the amount of tin added to Example 10 was 40 wt %.

(Effects of Heat Treatment Step S14)

First, in order to study the effects of the heat treatment step S14, the XRD patterns in Examples 2 to 6 were measured. Table 1 shows the lattice constants La in the a-axis direction, the lattice constants Lc in the c-axis direction, the volumes, and Tc obtained from the XRD patterns.

With reference to Table 1, it was found that carrying out the heat treatment step S14 within a temperature range of the heat treatment temperature of not less than 300° C. and not more than 700° C. allowed Tc to increase to a range from a temperature of 32.3K to a temperature close to 35K.

With reference to (a) of FIG. 6, Examples 5 and 6, each of which was subjected to the heat treatment at a heat treatment temperature of not more than 700° C., exhibited the XRD patterns not greatly different from that of Example 1, which was not subjected to the heat treatment step S14. Each of Examples 5 and 6 exhibited higher Tc than that of Example 1, as shown in Table 1. From this, it is considered that an impurity adversely affecting the superconducting properties of the polycrystalline bulk body 1 was not generated in Example 5 or 6.

TABLE 1

| Heat treatment temperature | Lattice constant (Å) | | Volume (Å$^3$) | Tc (K) |
| --- | --- | --- | --- | --- |
| | La | Lc | | |
| w/o heat treatment | 3.872(8) | 12.840(4) | 192.595 | 32.3 |
| 300° C. | 3.874(5) | 12.883(8) | 193.411 | 34.8 |
| 400° C. | 3.870(9) | 12.868(1) | 192.818 | 34.8 |
| 500° C. | 3.869(5) | 12.890(5) | 193.014 | 34.7 |
| 600° C. | 3.877(9) | 12.888(9) | 193.833 | 34.9 |
| 700° C. | 3.863(7) | 12.852(3) | 191.861 | 34.5 |

Meanwhile, Comparative Examples 1 and 2, which were subjected to the heat treatments at heat treatment temperatures of 800° C. and 900° C., respectively, did not exhibit superconductivity. Referring to (a) of FIG. 6, most of the peaks originated by CaK1144 disappeared, whereas many peaks originated by other compounds were observed. From this, it is considered that, in each of Comparative Examples 1 and 2, CaK1144 was decomposed and turned into impurities not exhibiting superconductivity.

(b) of FIG. 6 shows the XRD pattern of Example 1, which was not subjected to the heat treatment step S14, and the XRD pattern of Example 6, which is one example subjected to the heat treatment step S14. (b) of FIG. 6 revealed that carrying out the heat treatment step S14 increased the lattice constant Lc.

(Effects of Addition of Tin)

Next, in order to study the effects of the heat treatment step S14 involving addition of tin, the temperature dependencies of diamagnetization, the temperature dependencies of Jc, and the XRD patterns were measured for Examples 7 to 10. Note that, in FIGS. 7 and 8, Example 1, which was not subjected to the heat treatment step S14 and did not contain tin, was also plotted.

(a) of FIG. 7 revealed that increasing the added amount of tin from 0 wt % increased the diamagnetization. However, the diamagnetization was maximized in Example 9 in which the added amount of tin was 30 wt %, whereas the diamagnetization remarkably dropped in Example 10 in which the added amount of tin was 40 wt %.

(b) of FIG. 7 revealed that Jc had a similar tendency to that of the diamagnetization. For example, focusing on Jc observed in a state where no magnetic field was applied, although Jc increased as increase in the added amount of tin from 0 wt %, Jc peaked in Example 9 and Jc dropped remarkably in Example 10.

From (c) of FIG. 7, it was found that Jc increased as increase in the added amount of tin, and Jc peaked at 30 wt % and dropped at 40 wt %.

Meanwhile, from (c) of FIG. 7, it was found that Tc of each of Examples 7 to 10 was hardly affected by the added amount of tin. This suggests that tin was filled in the grain boundary of each crystal grain of the compound 10 and that tin did not intrude into the crystal grain or break the crystal grain. Note that the reason why Example 1, which was not subjected to the heat treatment step S14 and did not contain tin, exhibited a lower Tc than those of Examples 7 to 10 is the absence of the heat treatment step S14 and is irrelevant to the added amount of tin.

Also, FIG. 8 revealed that peaks originated by tin became higher as increase in the added amount of tin from 0 wt % to 40 wt % and that the peaks originated by CaK1144 were substantially preserved also in Example 10 in which the added amount of tin was 40 wt %. This suggests that tin was filled in the grain boundary of each crystal grain of the compound 10 and that tin did not intrude into the crystal grain or break the crystal grain. The result shown in FIG. 8 matches the electron microscopic images shown in FIG. 2. In the electron microscopic images shown in FIG. 1, as increase in the added amount of tin, the network of tin more developed and thus the tin-rich region became outstanding.

SUPPLEMENTARY NOTE

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

1: Polycrystalline bulk body
10: Compound

11: A site
12: A' site
13: Fe site
14, 15: As site
16: $AFe_2As_2$ layer
17: $A'Fe_2As_2$ layer

The invention claimed is:

1. A polycrystalline bulk body comprising:
crystal grains each of which is an iron-based compound expressed by chemical formula $AKFe_4As_4$, where A is Ca, part of A is optionally substituted by at least one of Sr and Eu,
the iron-based compound having a crystal structure in which $AFe_2As_2$ layers and $KFe_2As_2$ layers are alternately stacked,
the crystal structure having a space group of a simple tetragonal crystal P4/mmm,
the iron-based compound exhibiting superconductivity in a temperature range below a critical temperature,
the crystal structure having a lattice constant, in a c-axis direction, of not less than 12.85 Å.

2. The polycrystalline bulk body as set forth in claim 1, wherein the polycrystalline bulk body contains at least one selected from tin, gallium, and indium.

3. The polycrystalline bulk body as set forth in claim 2, wherein said at least one selected from tin, gallium, and indium is filled in at least part of a grain boundary of each of the crystal grains.

4. A method for producing a polycrystalline bulk body of an iron-based compound expressed by chemical formula $AKFe_4As_4$, where A is Ca, part of A is optionally substituted by at least one of Sr and Eu,
said method comprising:
a mixing step of mixing elements A, A', Fe, and As or compounds containing A, A', Fe, and As, each of which is a starting material;
a pressurizing step of pressurizing a mixture resulting from the mixing in the mixing step; and
a heating step of heating the mixture at a temperature of not less than 750° C. and not more than 1000° C. in a state where the mixture is sealed in a container, the heating step being carried out after or in parallel with the pressurizing step,
the iron-based compound having a crystal structure, and the crystal structure having a lattice constant, in a c-axis direction, of not less than 12.85 Å.

5. The method as set forth in claim 4, wherein the heating step is carried out by a spark plasma sintering technique.

6. The method as set forth in claim 4, further comprising:
a heat treatment step of subjecting, to a heat treatment at a temperature of less than 750° C., the mixture having been subjected to the heating step.

7. The method as set forth in claim 6, wherein the heat treatment step subjects the mixture to the heat treatment in a state where the mixture and at least one selected from tin, gallium, and indium are sealed in the container.

* * * * *